(12) United States Patent
Starkston et al.

(10) Patent No.: US 7,332,423 B2
(45) Date of Patent: Feb. 19, 2008

(54) SOLDERING A DIE TO A SUBSTRATE

(75) Inventors: Robert Starkston, Phoenix, AZ (US); Sridhar Narasimhan, Chandler, AZ (US); Chia-Pin Chiu, Tempe, AZ (US); Suzana Prstic, Chandler, AZ (US); Patrick N Stover, Gilbert, AZ (US); Hong Xie, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 11/170,188

(22) Filed: Jun. 29, 2005

(65) Prior Publication Data

US 2007/0001318 A1 Jan. 4, 2007

(51) Int. Cl.
*H01L 21/44* (2006.01)

(52) U.S. Cl. .................. 438/612; 438/613; 438/615

(58) Field of Classification Search .............. 257/734; 438/612, 613, 615
See application file for complete search history.

(56) References Cited

U.S. PATENT DOCUMENTS 6,365,842 B1 * 4/2002 Jiang ..................... 174/261
7,135,771 B1 * 11/2006 Khandekar et al. ...... 257/737
7,148,086 B2 * 12/2006 Shim et al. .............. 438/123
2005/0263888 A1 * 12/2005 Jiang et al. .............. 257/738

OTHER PUBLICATIONS

McGovern, L. P., et al., "High-Throughput, Low-Cost Flip Chip-on-Board Assembly", *Electronic Packaging & Production*, 38(2), (Feb. 1998), 68-76.
Wong, C P., et al., "High Performance No Flow Underfills for Low-Cost Flip-Chip Applications", *Proceedings, 47th IEEE Electronic Components and Technology Conference*, (1997), 850-858.

* cited by examiner

*Primary Examiner*—Wai-Sing Louie
(74) *Attorney, Agent, or Firm*—Schwegman, Lundberg & Woessner, P.A.

(57) ABSTRACT

One example electronic assembly includes a substrate that has a plurality of contacts which become bonded to a plurality of contacts on a die. The electronic assembly further includes a male member that extends from at least one of the substrate and the die and a female member that extends from the other of the substrate and the die. The male member is inserted into the female member to align the die relative to the substrate. The male member and the female member may have any configuration as long as one or more portions of the male member extend partially, or wholly, into the female member. An example method includes aligning a die relative to a substrate by inserting a male member that extends from one of the die and the substrate into a female member that extends from the other of the die and the substrate.

12 Claims, 8 Drawing Sheets

SOLDERING A DIE TO A SUBSTRATE

TECHNICAL FIELD

Some example embodiments of the present invention relate to connecting a die to a substrate, and more particularly, to soldering an electronic package that includes a die to a motherboard.

BACKGROUND

The current paths in electronic assemblies that include processors are continually being required to handle ever-increasing amounts of current in order to power the processors. Processors typically require more power in order to operate at higher frequencies and to simultaneously perform numerous logic and memory operations. As processor power densities continue to increase, so too does the structural and thermal challenge of adhering electronic packages that include dies to a substrate (e.g., a motherboard).

One example method of attaching a die to a substrate includes soldering the die to the substrate and then injecting an underfill between the die and the substrate. Capillary flow causes the underfill to seal the area between the die and the substrate that is not occupied by the soldered areas of connection. One drawback with soldering the die to the substrate is that the various components contract at different rates during bonding.

Since the die, solder and substrate contract at different rates, stress forms within the die, solder and substrate as the solder hardens to bond the die to the substrate. In addition, placing the underfill between the die and the substrate after solder bonding serves to lock in the stress within the various components. This stress becomes exacerbated by the cyclical heating that such electronic assemblies are exposed to under varying load conditions.

The stress within the various components makes the electronic assemblies vulnerable to unwanted cracking (e.g., when a motherboard is mounted within a chassis that is shipped to an end user). The shock and vibration forces that are generated during shipping can be particularly detrimental to such electronic assemblies.

One recent method of attaching a die to a substrate includes thermal compression bonding (TCB) the die to the substrate. A typical TCB process includes covering solder bumps on a substrate with an underfill and then positioning solder bumps on a chip against the solder bumps on the substrate. Heat and force are simultaneously applied to the solder bumps to cause simultaneous solder interconnect reflow and underfill cure. One of the advantages of TCB over a conventional capillary flow process is that the extra processing steps that are associated with a capillary flow process (e.g., flux application, flux residue cleaning and secondary thermal curing of the underfill) are eliminated.

Despite numerous processing advantages, TCB presently suffers from a major drawback in that the interconnect yield rate of the soldered connections is very low, especially when fillers are contained in the underfill material. A significant amount of filler is typically required in an underfill material in order improve the reliability of the connection between a die and a substrate. Reliability tests have shown that at least 50 percent by weight of fillers is required in an underfill in order to improve solder joint reliability.

The interconnect yield rate is typically very low when fillers are used in the underfill because the fillers are normally made of a very hard material that tends to become entrapped between the die and substrate bumps. This entrapment of the filler/underfill sometimes prevents the die bumps from making adequate contact with substrate bumps such that solder joints are unable to properly form.

There have been attempts to address the filler entrapment problem by forming the die and substrate bumps with rounded tips. However, the rounded tips cause other concerns in that the rounded die bumps tend to slip over the rounded solder bumps as force is applied during the TCB process. This slipping between the rounded die and substrate bumps can cause the die and the substrate to become misaligned. The die and the substrate can become so misaligned that the interconnect yield rate between the die bumps and the substrate bumps is adversely affected.

DETAILED DESCRIPTION

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

Figure 1:
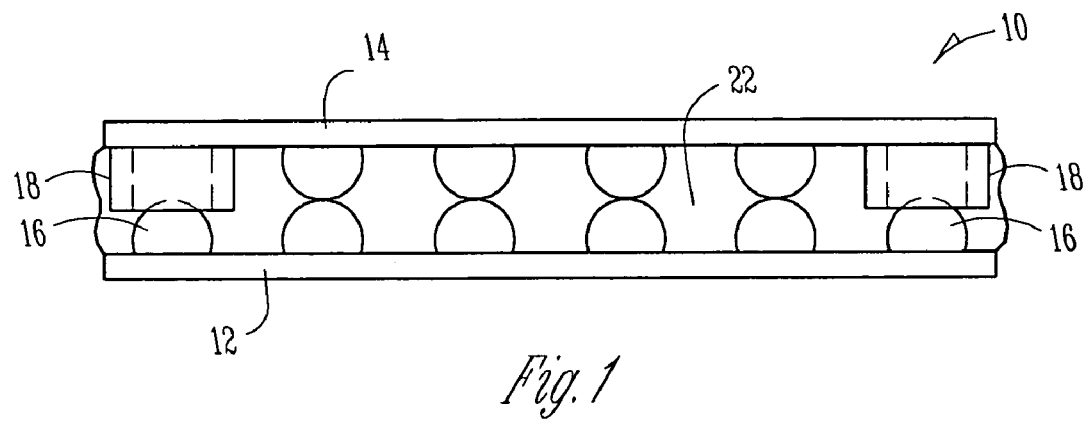
FIG. 1 illustrates an example embodiment of an electronic assembly that includes a die bonded to a substrate.
Figure 2:
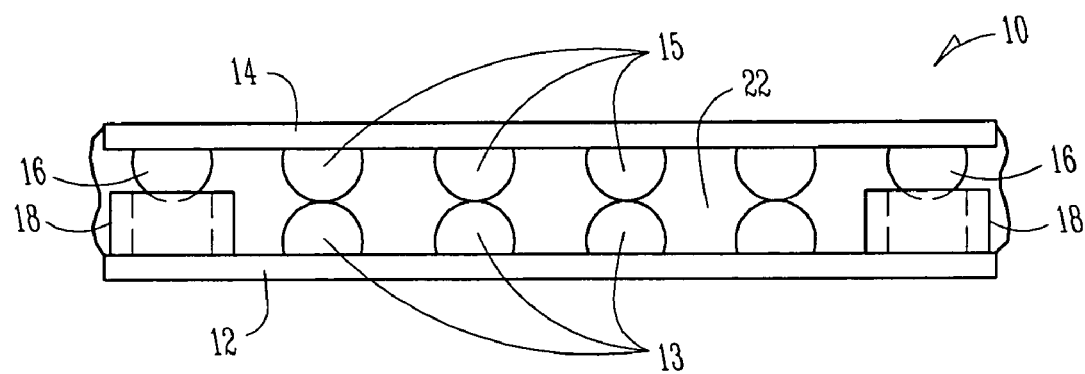
FIG. 2 illustrates another example embodiment of an electronic assembly that includes a die bonded to a substrate.

FIGS. 1 and 2 illustrate an electronic assembly 10 that includes a substrate 12 and a die 14. The substrate 12 includes a plurality of contacts 13 that become bonded to a plurality of contacts 15 on the die 14. The electronic assembly 10 further includes a male member 16 and a female member 18. The male member 16 extends from at least one of the substrate 12 and the die 14 and the female member 18 extends from the other of the substrate 12 and the die 14. The male member 16 is inserted into the female member 18 to align the die 14 relative to the substrate 12.

FIG. 1 shows an example embodiment where the male member 16 extends from the substrate 12 while FIG. 2 shows an example embodiment where the male member 16 extends from the die 14. The male member 16 and the female member 18 may have any configuration as long as one or more portions of the male member 16 extend partially, or wholly, into the female member 18.

Although it is not clearly illustrated in FIGS. 1 and 2, the substrate may be part of motherboard and the die 14 may part of an electronic package. In addition, the die 14 and substrate 12 may be at least partially encapsulated by a protective material (not shown in FIGS. 1 and 2). Die 14 may be made of semiconducting material that has been separated from a wafer. Wafers may be made of semiconducting, non-semiconducting, or combinations of semiconducting and non-semiconducting materials.

It should be noted that die 14 may be a processor of any type. As used herein, processor means any type of circuit such as, but not limited to, a microprocessor, a microcontroller, a graphics processor or a digital signal processor. Die 14 may also be a custom circuit or an application-specific integrated circuit, such as a communications circuit for use in wireless devices such as cellular telephones, pagers, portable computers, two-way radios, and similar electronic systems.

Figure 3:
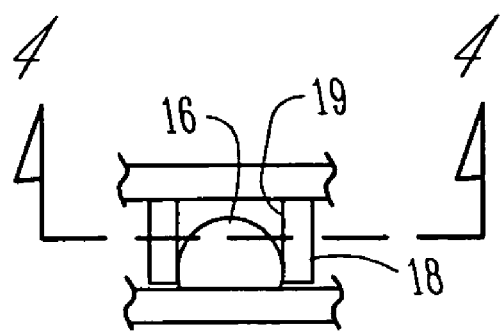
FIG. 3 is an enlarged view of an example male member and an example female member that may be included in the electronic assembly shown in FIG. 1.
Figure 4:
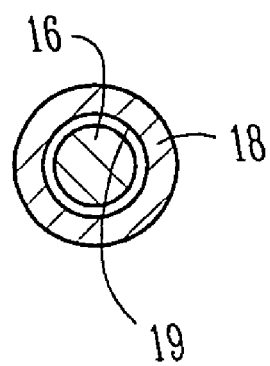
FIG. 4 is a section view of the male member and the female member that are shown in FIG. 3 taken along line 4-4.

FIG. 3 is an enlarged view of the male member 16 and the female member 18 that are included in the electronic assembly 10 which is shown in FIG. 1. FIG. 4 is a section view of the male member 16 and the female member 18 that are shown in FIG. 3 taken along line 4-4. As shown in FIGS. 3 and 4, male member 16 may be spherical and the female member 18 may be cylindrical with a circular opening 19 that receives the spherical male member 16.

Figure 5:
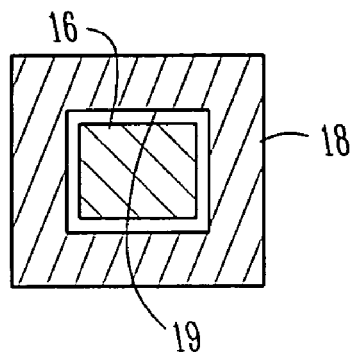
FIGS. 5-7 are section views that are similar to FIG. 4 and illustrate other example embodiments for the male member and the female member.
Figure 6:
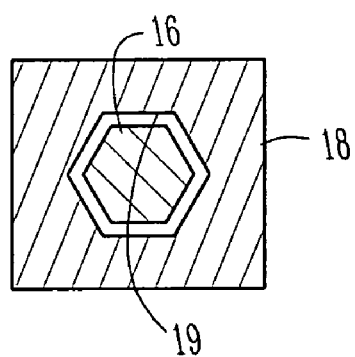
Figure 7:
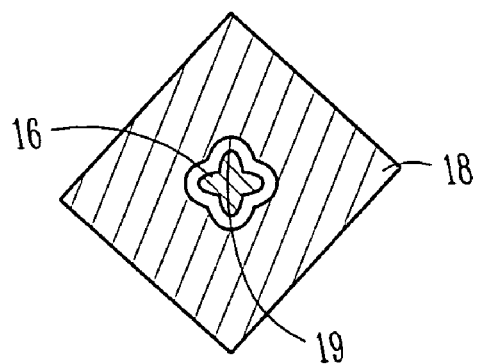
Figure 8:
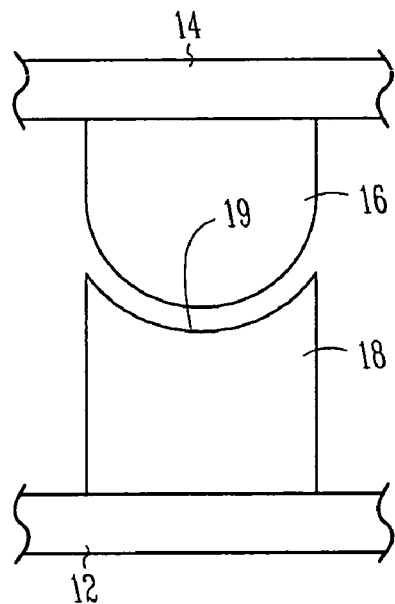
FIGS. 8-10 are enlarged views that are similar to FIG. 3 and illustrate still other example embodiments for the male member and the female member.
Figure 9:
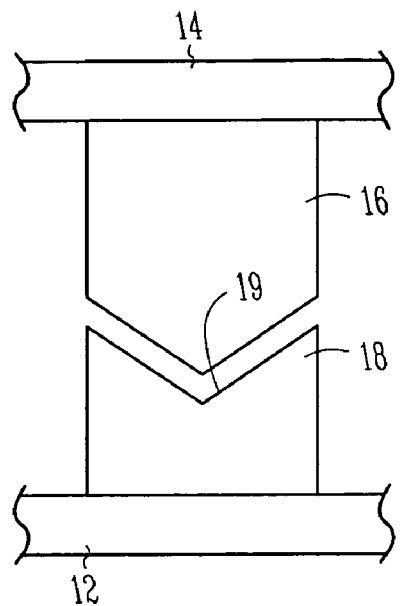
Figure 10:
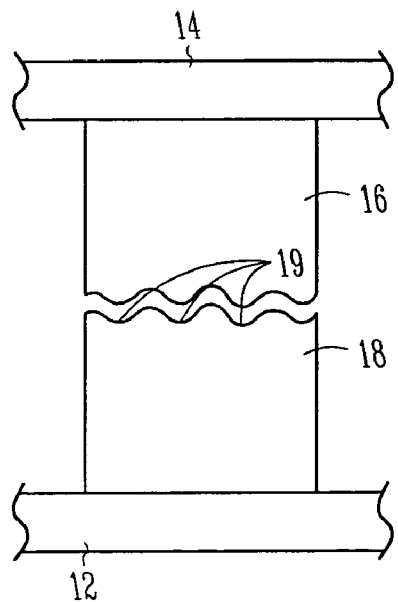

FIGS. 5-7 are similar section views to FIG. 4 and illustrate other example embodiments for the male member 16 and the female member 18. In addition, FIGS. 8-10 are similar views to FIG. 3 and illustrate still other example embodiments for the male member 16 and the female member 18.

In some embodiments, the male and/or female members 16, 18 may extend perpendicularly from the respective surfaces of the substrate 12 and die 14. It should be noted that the male member 16 and the female member 18 (as well as the corresponding openings in the female member 18) may be any size, shape or geometry that facilitates aligning the die 14 relative to the substrate 12. In addition, the male member 16 may inserted to any depth within female member 18. The size, shape and geometry of the male and female members 16, 18, and the amount of insertion of the male member 16 into the female member 18, may depend in part on (i) manufacturing considerations; and (ii) the application where the electronic assembly 10 will be used (among other factors). In some embodiments, at least some of the male and female members 16, 18 may have one configuration while other of the male and female members 16, 18 may have a different configuration.

As shown in FIGS. 1 and 2, the electronic assembly 10 may further include an underfill 22 that is between the die 14 and substrate 12 to facilitate bonding the die 14 to substrate 12. The underfill 22 may be positioned between the die 14 and the substrate 12 as part of a capillary flow process or a thermal compression bonding process. The underfill 22 may contain one or more fillers that are added to the underfill 22 to improve the reliability of the connection between the die 14 and substrate 12. As an example, the underfill 22 may include at least 50 percent by weight of fillers.

Figure 11:
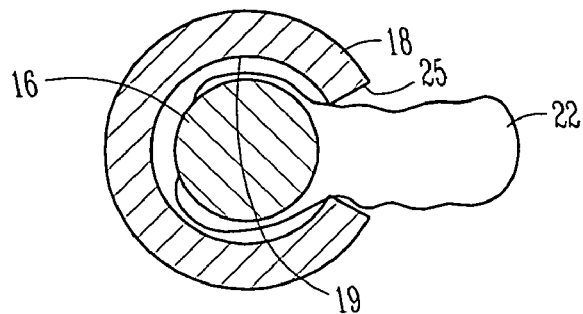
FIGS. 11-13 are section views that are similar to FIG. 4 and illustrate example embodiments where the female member partially surrounds the male member.
Figure 12:
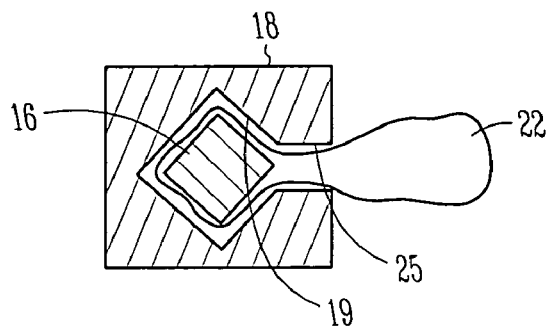
Figure 13:
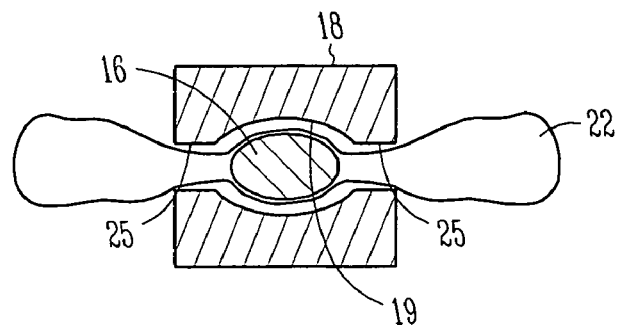

FIGS. 11-13 are section views that are similar to FIG. 4. FIGS. 11-13 illustrate example embodiments where the female member 18 only partially surrounds the male member 16. Only partially surrounding the male member 16 with the female member 18 may be desirable during thermal compression bonding (TCB) of the die 14 to the substrate 12.

As an example, when heat in combination with a force is applied to press the contacts 15 on the die 14 against the contacts 13 on the substrate 12, the underfill 22 may be pushed out through one or more openings 25 in the female member 18. Forcing the underfill 22 through the openings 25 in the female member 18 may reduce the opportunity for the underfill 22 to become entrapped between the male member 16 and the female member 18. Removing the underfill from between the male and female members 16, 18 may be especially beneficial when the male and female members 16, 18 are electrically connected to the die 14 (or some other electronic device).

Figure 14:
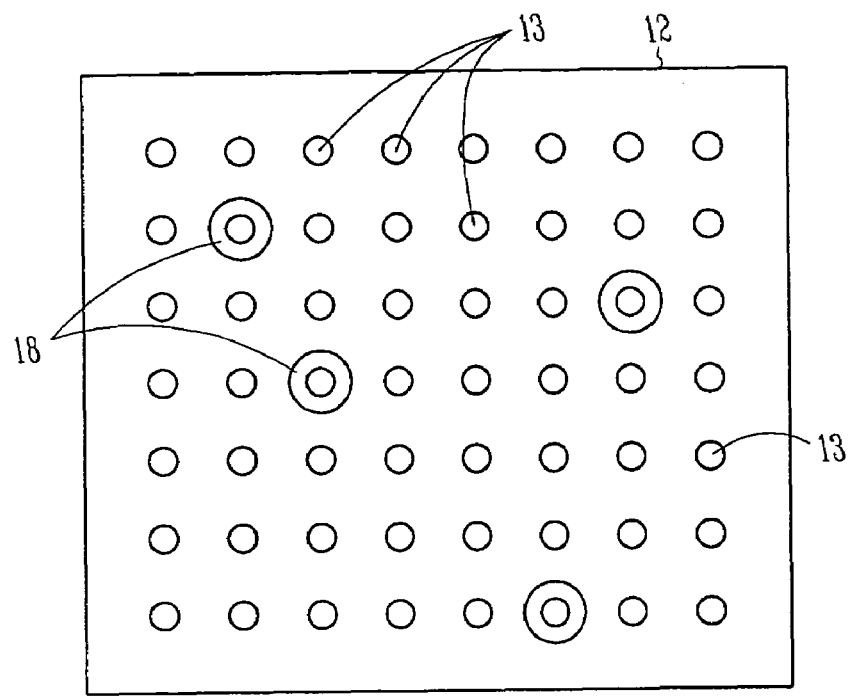
FIG. 14 is an upper view of an example substrate that may be used in the electronic assembly shown in FIG. 2.

FIG. 14 is an upper view of an example substrate 12 that may be used in the electronic assembly shown in FIG. 2. FIG. 14 shows that the female member 18 may be one of a plurality of female members 18 that extend from the substrate 12. Each of the female members 18 is adapted to receive a respective male member 16 (not shown in FIG. 14) to align the die 14 relative to the substrate 12.

In the example embodiment that is illustrated in FIG. 14, the plurality of female members 18 are distributed arbitrarily throughout the plurality of contacts 13 on the substrate 12. The male members 16 on the die 14 are correspondingly distributed arbitrarily throughout the plurality of contacts 15 on the die 14.

In some embodiments, the plurality of female members 18 may extend from the die 14 instead of the substrate 12 and the plurality of male members 16 may extend from the substrate 12 instead of the die 14. In other embodiments, the plurality of female members 18 and the plurality of male members 16 may extend from both the substrate 12 and the die 14.

Figure 15:
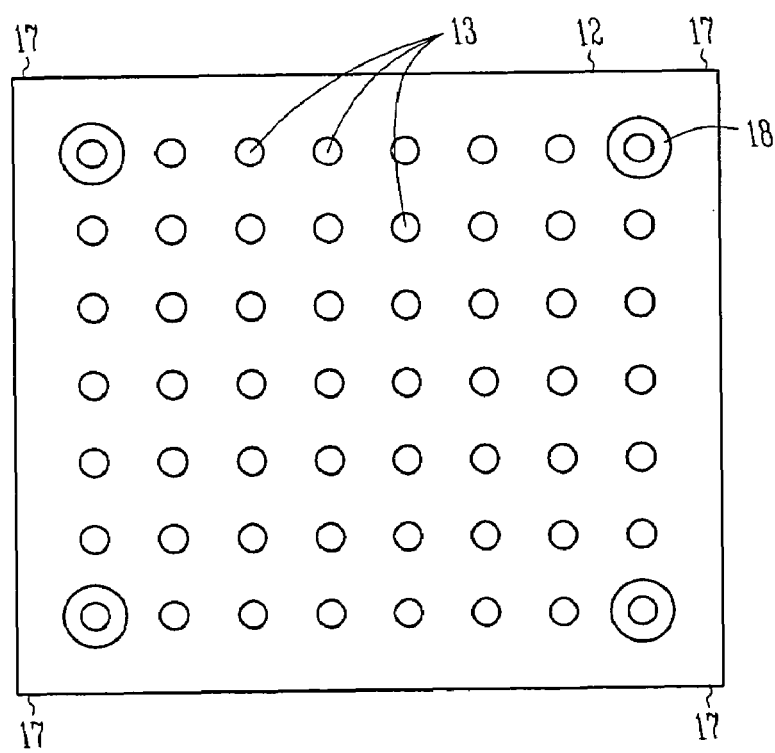
FIG. 15 is an upper view of another example substrate that may be used in the electronic assembly shown in FIG. 2.

FIG. 15 is an upper view of another example substrate 12 that may be used in the electronic assembly shown in FIG. 2. FIG. 15 shows an example embodiment where a female member 18 (or male member 16 in other embodiments) is positioned at or near each corner 17 of the substrate 12.

The male and female members 16, 18 may be made from the same material or different materials. Some example materials for male and female members 16, 18 include gold, silver, copper, tin, solder and alloys comprised of any combination of tin, bismuth, lead and/or indium. The types of materials that are selected for the male member 16 and the female member 18 will depend on the application where the electronic assembly 10 is to be used. It should be noted that the male and female members 16, 18 may or may not be used to carry signals to the die 14 and/or provide power to the die 14.

In the example embodiment shown in FIGS. 1 and 2, the plurality of contacts 15 on the die 14 are solder bumps and the plurality of contacts 13 on the substrate 12 are solder bumps. It should be noted that the plurality of contacts 15 on the die 14 and the plurality of contacts 13 on the substrate 12 may be any size, shape or geometry that permits the die 14 to be bonded to substrate 12.

The size, type and alignment of a die 14, or an electronic package that includes die 14, may vary depending on the design of electronic assembly 10. In addition, the components in the electronic assembly 10 will be determined based on the space available and the application where electronic assembly 10 is to be used (among other factors).

Figure 16:
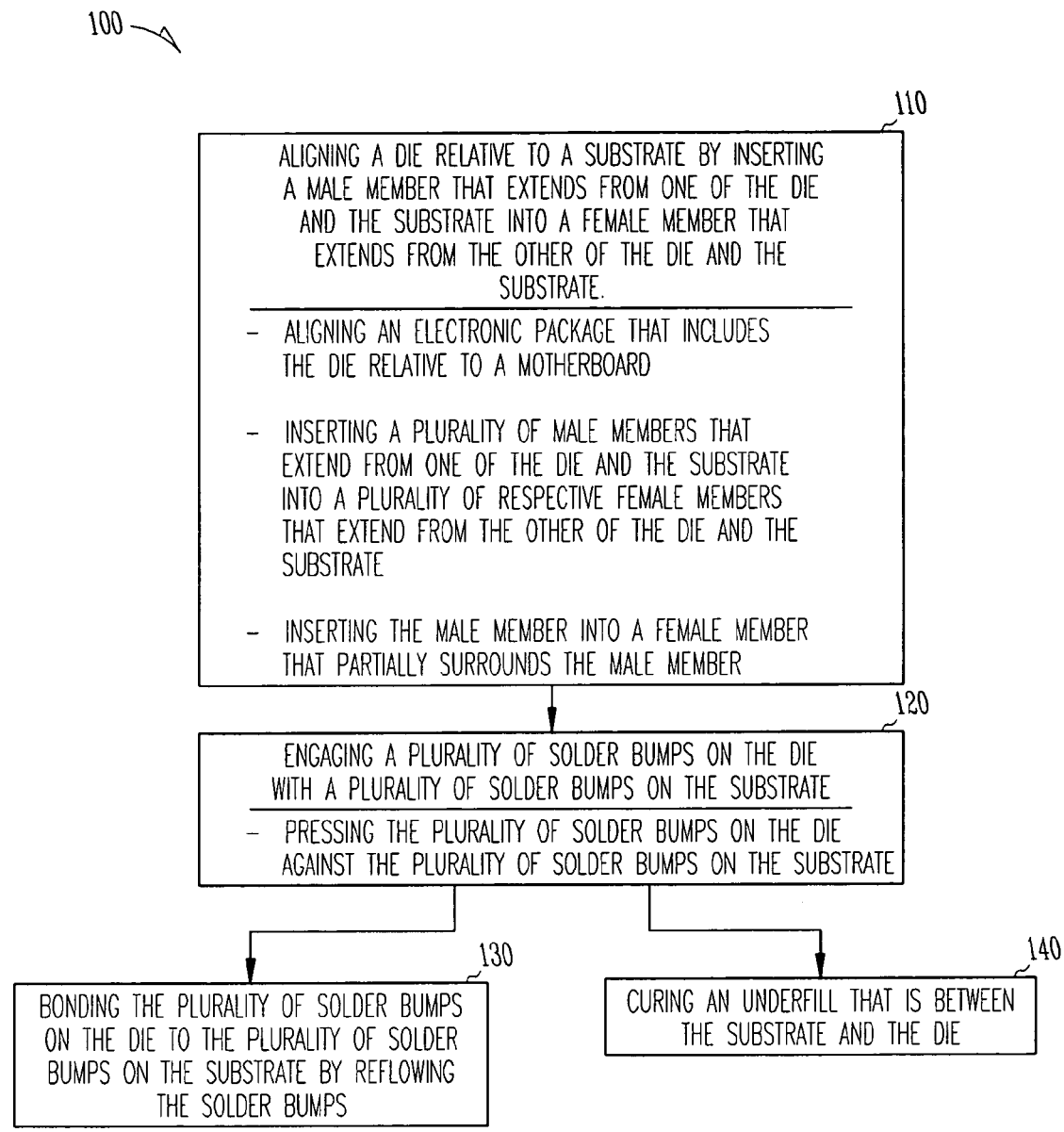
FIG. 16 is a flow diagram that illustrates an example method of aligning a die relative to a substrate.

FIG. 16 illustrates an example embodiment of a method 100 that includes 110 aligning a die relative to a substrate by inserting a male member that extends from one of the die and the substrate into a female member that extends from the other of the die and the substrate. The method further includes 120 engaging a plurality of solder bumps on the die with a plurality of solder bumps on the substrate and 130 bonding the plurality of solder bumps on the die to the plurality of solder bumps on the substrate by reflowing the solder bumps.

The method may further include 140 curing an underfill that is between the substrate and the die. It should be noted that reflowing the solder bumps may occur simultaneously with 140 curing the underfill that is between the substrate and the die.

In some embodiments, 110 aligning the die relative to the substrate may include (i) aligning an electronic package that includes the die relative to a motherboard; (ii) inserting a plurality of male members that extend from one of the die and the substrate into a plurality of respective female members that extend from the other of the die and the substrate; and/or (iii) inserting a male member into a female member that only partially surrounds the male member. In addition, 120 engaging the plurality of solder bumps on the die with the plurality of solder bumps on the substrate may include pressing the plurality of solder bumps on the die against the plurality of solder bumps on the substrate (e.g., in a TCB process).

Figure 17:
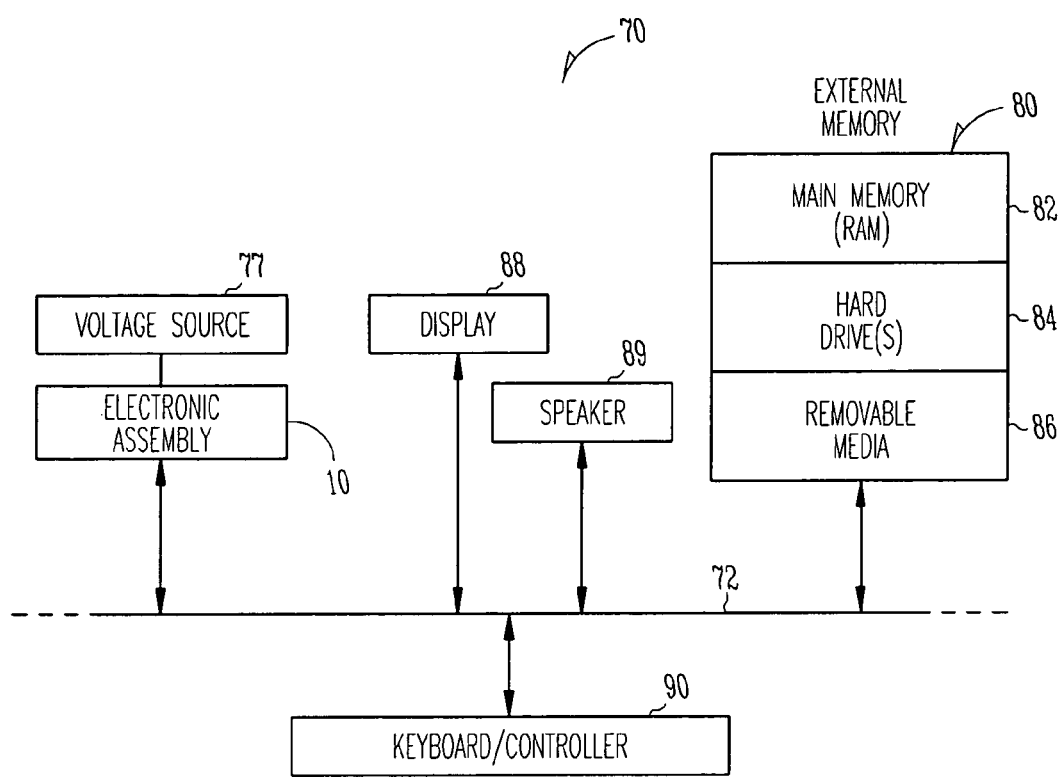
FIG. 17 is a schematic diagram of an electronic system that incorporates an electronic assembly.

FIG. 17 is a block diagram of an electronic system 70 that incorporates at least one electronic assembly (e.g., electronic assembly 10 shown in FIG. 1 or FIG. 2) described herein. Electronic system 70 may be a computer system that includes a system bus 72 which electrically couples the various components of electronic system 70 together. System bus 72 may be a single bus or any combination of busses.

Electronic assembly 10 is electrically coupled to system bus 72 and as discussed above may include any circuit, or combination of circuits. Electronic system 70 may also include an external memory 80 that in turn may include one or more memory elements suitable to a particular application. Some example memory elements include a main memory 82 in the form of random access memory (RAM), one or more hard drives 84, and/or one or more drives that handle removable media 86, such as diskettes, compact disks (CDs), digital video disks (DVDs) and any USB devices. The electronic system 70 may also include a display device 88, a speaker 89, and a controller 90, such as a keyboard, mouse, trackbump, game controller, microphone, voice-recognition device, or any other device that inputs information into the electronic system 70.

In some embodiments, electronic system 70 further includes a voltage source 77 that is electrically coupled to electronic assembly 10. Voltage source 77 may be used to supply power to a die (e.g., a processor) that is within electronic assembly 10.

The methods and electronic assemblies described herein may be implemented in a number of different embodiments, including an electronic package, an electronic system, a computer system, and one or more methods of fabricating an electronic assembly. The elements, materials, geometries, dimensions, and sequence of operations can all be varied to suit particular packaging requirements.

FIGS. 1-17 are merely representational and are not drawn to scale. Certain proportions thereof may be exaggerated while others may be minimized.

The electronic assembly and method described above may provide a solution for bonding an electronic package to a motherboard, especially thermal compression bonding an electronic package that includes a die to a motherboard. Many other embodiments will be apparent to those of skill in the art from the above description.

What is claimed:

1. A method comprising:
   aligning a die relative to a substrate by inserting a male member that extends from one of the die and the substrate into a female member that extends from the other of the die and the substrate and only partially surrounds the male member; and
   reflowing the male member and female member by applying heat in combination with a force to press the male member against the female member and push an underfill through an opening in the female member.

2. The method of claim 1 wherein aligning the die relative to the substrate includes aligning an electronic package that includes the die relative to a motherboard.

3. The method of claim 1 further comprising engaging a plurality of solder bumps on the die with a plurality of solder bumps on the substrate.

4. The method of claim 1 wherein aligning the die relative to the substrate includes inserting a plurality of male members that extend from one of the die and the substrate into a plurality of respective female members that extend from the other of the die and the substrate.

5. A method comprising:
   aligning a die relative to a substrate by inserting a plurality of male members that extend from one of the die and the substrate into a plurality of respective female members that extend from the other of the die and the substrate;
   engaging a plurality of solder bumps on the die with a plurality of solder bumps on the substrate such that the plurality of male members and the plurality of female members are distributed arbitrarily throughout the plurality of solder bumps on the substrate and the plurality of solder bumps on the die; and
   bonding the plurality of solder bumps on the die to the plurality of solder bumps on the substrate by reflowing the solder bumps.

6. The method of claim 5 further comprising curing an underfill that is between the substrate and the die.

7. The method of claim 6 wherein reflowing the solder bumps occurs simultaneously with curing the underfill that is between the substrate and the die.

8. The method of claim 5 wherein aligning the die relative to the substrate includes aligning an electronic package that includes the die relative to a motherboard.

9. A method comprising:
   aligning a die relative to a substrate by inserting a plurality of male members into a plurality of respective female members, wherein some of the male members extend from the die and other of the male members extend from the substrate in addition to some of the female members extending from the die and other of the female members extending from the substrate;
   engaging a plurality of solder bumps on the die with a plurality of solder bumps on the substrate;
   bonding the plurality of male members to the plurality of female members by reflowing the male members and the female members; and
   bonding the plurality of solder bumps on the die to the plurality of solder bumps on the substrate by reflowing the solder bumps.

10. The method of claim 9 further comprising curing an underfill that is between the substrate and the die.

11. The method of claim 9 wherein reflowing the solder bumps occurs simultaneously with curing the underfill that is between the substrate and the die.

12. The method of claim 9 wherein aligning the die relative to the substrate includes aligning an electronic package that includes the die relative to a motherboard.

* * * * *